United States Patent

[11] 3,596,139

[72] Inventor Ronald A. Walsh
191 Plymouth Lane, Apt. A., Glen Burnie, Md. 21061

[21] Appl No 870,518
[22] Filed Oct. 22, 1969
[45] Patented July 27, 1971

[54] IMPROVED ELECTRONIC COMPONENT ASSEMBLY CYLINDRICAL SHELL HOUSING WITH INNER PERIPHERAL RADIATING FIN CIRCUIT BOARD FASTENER MEANS
10 Claims, 6 Drawing Figs.

[52] U.S. Cl. 317/101 R, 174/68.5
[51] Int. Cl. H05k 5/06
[50] Field of Search 317/101, 99, 101 DH, 100, 101 D; 174/68.5, 52, 72, 82; 339/17, 119, 128, 129; 200/168 G

[56] References Cited
UNITED STATES PATENTS

| | | | |
|---|---|---|---|
| 2,633,526 | 3/1953 | Snyder | 174/68.5 X |
| 2,820,866 | 1/1958 | Graybill et al. | 200/168 (G) X |
| 2,833,966 | 5/1938 | Goodier et al. | 317/101 |
| 2,976,806 | 3/1961 | Risk et al. | 317/101 |
| 3,087,095 | 4/1963 | McConkey, Jr. et al. | 317/99 |
| 3,219,886 | 11/1965 | Katzin | 317/101 (D) UX |
| 3,234,433 | 2/1966 | Braunagel | 174/68.5 X |
| 3,257,585 | 6/1966 | Ransom et al. | 317/101 |
| 3,414,806 | 12/1968 | Carr | 174/68.5 X |
| 3,500,131 | 3/1970 | Seeley et al. | 317/101 (DH) X |

*Primary Examiner*—J. R. Scott
*Attorney*—John F. McClellan, Sr.

ABSTRACT: Demountable assembly and packaging means and method securing rectangular circuit boards in axially symmetrical tubular configuration in a cylindrical housing without the use of conventional attachment hardware, are described, including longitudinal grooves inside the housing with mountings fixed radially inwardly from the grooves, the inner ends of the mountings protruding between and receiving the edges of adjacent component boards, and the component boards and mountings having integral lay-in wireways permitting unfolding the assembly on removal from the housing without necessity for unwiring; the end closure of the housing is provided with inwardly detachable connectors receiving leads from the component boards to facilitate mounting and demounting; an axial spider having radial legs tightening the assembly of mountings and component boards is optionally provided.

BEST AVAILABLE COPY

INVENTOR.
R.A.WALSH.
BY John F. McClellan Sr.
ATTORNEY

BEST AVAILABLE COPY

INVENTOR.
R. A. WALSH
BY John F. McClellan Sr.
ATTORNEY

IMPROVED ELECTRONIC COMPONENT ASSEMBLY CYLINDRICAL SHELL HOUSING WITH INNER PERIPHERAL RADIATING FIN CIRCUIT BOARD FASTENER MEANS

This invention relates generally to electrical devices and more particularly to demountable assembly and packaging means and method for protecting interconnected electronic components against vibrational and environmental extremes.

Briefly described, one embodiment of the invention provides means and method for flexibly interconnecting special electronic component boards, having integral wireways, in a predetermined radial relation about a housing-closure plate thus affording complete access to the boards and interconnections for construction and testing, next folding the boards together into a predetermined compact relation about a central spider, thus forming a tubelike assembly symmetrically axial to the housing closure plate, then capping with slide rails the corners formed by the adjacent sides of the boards, the slide rails being adapted for containing the wires interconnecting the boards, and finally, containing and sealing the assembly by sliding a cylindrical housing over the slide rails and closing the open end of the housing with the housing closure plate. The cylindrical housing is provided with longitudinal grooves for sliding engagement with the slide rails at the corners of the tubelike assembly of boards.

By the means and method just described, and through similar provisions in other embodiments, it is an object of this invention to overcome and avoid several grave drawbacks inherent in conventional harsh-environment electronic packaging. In current practice, there is no generalized method of mounting electronic assemblies in cylindrical containers without the use of conventional fasteners and with instant access.

Typically, the old art methods employ flat-sided or box-type containers custom fabricated for each volume requirement, at high unit-cost. Stocking a variety of sizes of such containers would lead to large inventory investments and in practice is not feasible.

The close-tolerance heavy-wall fabrication by casting and welding methods necessary to achieve hermetic capability limit the choice of materials used in the old art methods.

Further disadvantages of the old art are that the box-type packaging of the old art requires assembly by soldering in the interior through access hatches; requires a multiplicity of conventional types of clamps, leads, and other interconnection fasteners subject to individual failure; is nonuniformly cushioned if at all; is difficult to balance and to stress-analyze; is aerodynamically and hydrodynamically awkward in contour; is difficult to purge with inert gas; and last but not least, is extremely difficult to inspect or modify after assembly, and awkward to secure uniformly other than by potting throughout.

Objects of the present invention therefore are to provide axially parallel packaging of electronic assemblies in tubular housings to facilitate changing housing volume where required, to make stocking an inventory of housings for various volumes more economical, to provide housings with lighter-weight walls and in a greater variety of materials than heretofore, and to obviate necessity for weldments, complex castings and complex machined parts.

Further and very important objects of the present invention are to provide means and method for assembly and testing with instant and complete fabrication and testing access to all parts prior to packaging; to provide for quick and secure mounting of the assembly within the housing without the use of conventional fasteners or potting, but with tight, uniformly cushioned support for all parts of the assembly; to provide for ready purging with inert gas; and to provide for quick, safe dismounting of the assembly from the housing for modification or further testing.

These and other objects of this invention will become more readily understood from examination of the following description, and the drawings in which.

Figures 1, 2, 3:
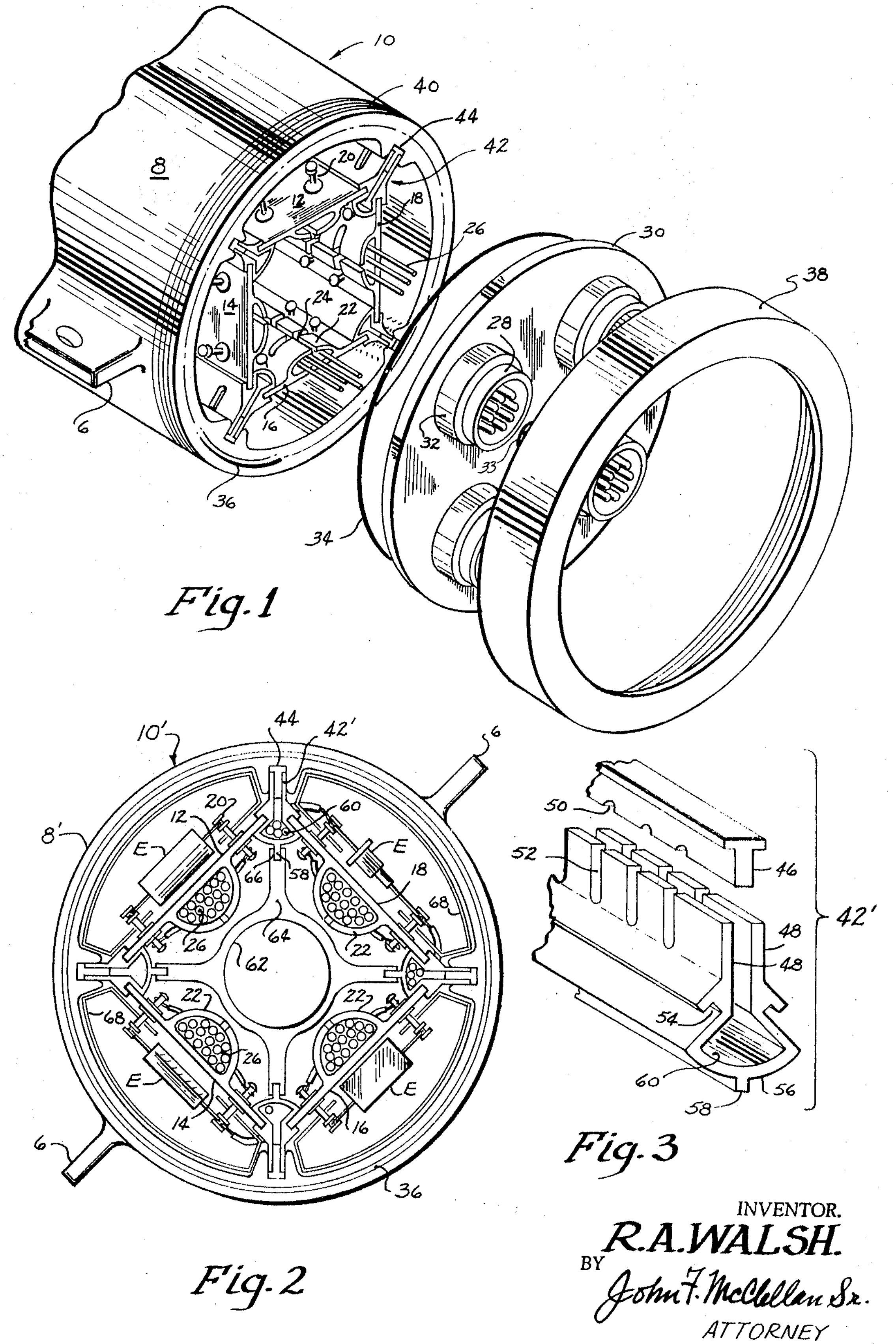
FIG. 1 is a partially exploded perspective view of an end portion of a housing and assembly according to this invention.
FIG. 2 is an end elevation of a part of the FIG. 1 device.
FIG. 3 is an exploded perspective view of a slide rail shown in FIGS. 1 and 2.
Figures 4, 5:
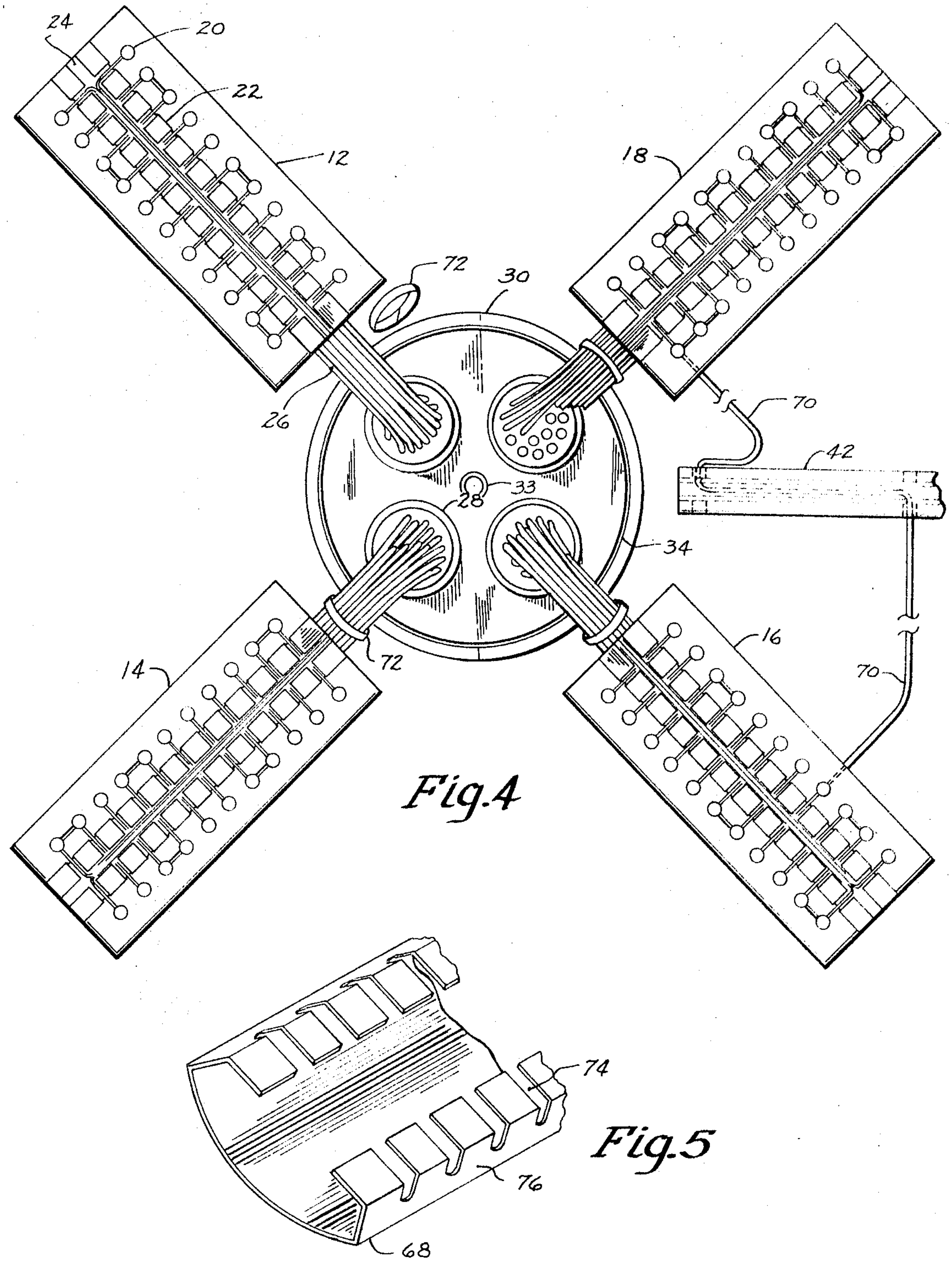
FIG. 4 is a plan view of elements of FIGS. 1 and 2 removed from the housing and opened outward 90°.
FIG. 5 is a perspective view of a portion of a shield which also appears in FIG. 2.

FIGS. 1 and 2 in the overall embodiments 10 and 10′ shown are essentially similar. The differences lie in provision of spider brace 62 and shield 68 in FIG. 2. FIG. 4 shows the component boards of either FIG. 1 or FIG. 2 removed from the housing and spread out by unfolding to provide access for testing, modification, and the like. Materials for the various components of the invention are given at the end of the detailed discussion of the figures.

FIGS. 1 and 2 indicate the general means and method of this invention in providing secure mounting for component boards 12, 14, 16 and 18 within a tubular housing 8. All boards are generally similar, being rectangular in configuration, and are conventionally perforated to receive turret lugs 20 and the like, which mount electronic components E.

One face of each board is provided with an integral wireway 22 of tubular configuration which is longitudinally and transversely slotted as at 24 in correspondence with the perforations, preferably, to provide local support for, and ready access to, the wires in wire bundles 26. It will be appreciated that the individual leads are installed by laying them in the apertures of the wireway, which is adapted for openly receiving and releasing them, as may be useful in folding and unfolding the assembly, or for other reasons.

Each of the wire bundles terminates in a standard hermetic electrical connector 28, FIG. 1, which leads through the wall of end plate 30, FIG. 1. These connectors are of the type sealed on the interior of the end plate 30 by an O-ring (not shown), and which will pass through the end plate to the interior on removal of knurled ring or hexagonal jam nut 32.

O-ring 34 is contained in groove 36 in the end of the tubular housing and seals the periphery of the end plate to the housing under constraint by internally threaded collar 38, which tightens on threads 40 on the end of the housing.

One or more hermetic fittings 33 are provided to facilitate purging the unit with dry nitrogen or the like after assembly.

Boards 12, 14, 16 and 18 are held in spaced relation within tubular housing 8 by combination slide rail and wireway assemblies 42, FIG. 1, and 42′, FIG. 2. These assemblies are contained in grooves 44 formed longitudinally in the inner wall of housing 8, and protrude radially inward between laterally adjacent edges of the component boards.

Component shields 68, FIG. 2, are explained more fully in a later figure.

The interior 60 of each combination slide rail assembly 42, FIG. 1 and 42′, FIG. 2, comprises a wire way adapted to contain the leads which interconnect the various component boards. The leads are installed by laying them in the wireway as will be seen, and preferably the interboard connections are made over-length to facilitate folding and unfolding the assembly.

The exteriors of the combination slide rail assemblies are recessed on either side to receive and support the edges of adjacent component boards, as will be seen in reference to a later figure. Additionally, each combination slide rail assembly 42′, FIG. 2, has an exterior flange 58 extending from the convex end 56 of the assembly.

These flanges 58 point radially inward when the assemblies 42′, FIG. 2, are mounted in housing grooves 44.

An optional feature of this invention, tubular spider brace 62, FIG. 2, has radial legs 64 with slotted ends 66 which engage the flanges 58 of the combination slide rail assemblies 42', radially expanding the slide rail assemblies and tightening the entire assembly of component boards mounted within the housing 8'.

FIG. 3 details the features of slide rail assemblies 42' which adapt them for tightening themselves, the component boards, and wire interconnections between the component boards, on radial expansion by the spider brace.

T-shaped cap 46 has periodic wire-slots 50 which match those slots 52 in the parallel spaced legs 48 of the slide rail assembly between which the T-shaped cap 46 fits. Both the legs and the caps fit within grooves 44 of the housing.

As the spider brace presses outward against flange 58, there are several tightening actions: (a) The convex end 56 is flattened, tending to grip more tightly any wire bundles in space 60; (b) flattening convex end 56 tends to close board slots 54, gripping the edges of the boards more tightly; (c) flattening convex end 56 tends to force legs 48 outward against the T-shaped cap 46 in groove 44, tightening slots 50 and 52 on any wire interconnections passing between them into bundle space 60; (d) flattening convex end 56 tends to separate legs 48 slightly, wedging the free ends of the legs more tightly in the groove 44 in which they are held.

It will be seen from FIG. 1 that the spider brace is not essential to retention of the components, which are securely affixed by the diagonally self-bracing, self-cushioning configuration shown there, but for extreme vibration and heavy load conditions the spider brace provides additional tightening, strength, and rigidity throughout.

It will be appreciated that the tubular body of the spider brace acts as an elastic member, and that it may be of greater or lesser diameter, and may itself be used as a wire way.

Mounting of the components in the housing may be accomplished in more than one sequence. For instance, the interior components may be completely assembled as shown in FIG. 1 except for the housing, and the housing then slid over them.

Following this, if the spider brace is to be used, it may then be inserted. Alternatively, the spider brace may be assembled with the rest of the components mounting in the housing.

FIG. 4 depicts the component boards, 12, 14, 16 and 18 removed from the tubular housing 8 of FIG. 1 and deployed radially from end plate 30, to which they are still connected, for modification or testing.

One of the combination slide rails 42 is shown at the side, accommodating an interconnective wire 70. The wire bundles 26, which may be held by tape or compression rings 72 if desired, may be inflexible, and if so, the connectors 28 are simply removed from the end plate before being deployed. In the FIG. 4 embodiment, only one end plate with electrical leads is required, and the cylindrical housing can either be a solid cup, or can have a removable blind closure at the end opposite end plate 30. Two end plates 30 may be used if leadouts are required at both ends of the assembly.

FIG. 5 details component shield 68 which is also shown in FIG. 2. This shield is made of an insulative material such as "Lexan," one of the polycarbonates and a trademarked product of the General Electric Company. The wire notches 74 in the recurved flanges 76 correspond in spacing to the holes in the component boards, and the shield is installed and retained by clipping the wire notches over any convenient turret lugs.

Figure 6:
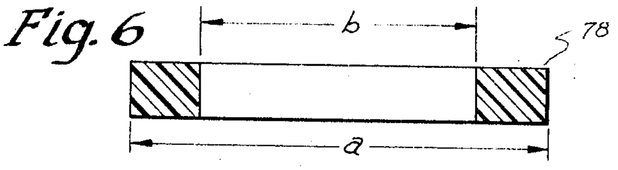
FIG. 6 is a section of a perforated-disc spacer.

FIG. 6 shows, in section, a perforated disc spacer 78 of resilient material such as foamed polystyrene or urethane, which can be used as a thrust washer to eliminate end-to-end backlash of the boards and slide rail assemblies within the housing. The outside diameter *a* of the disc is made less than the least diameter of the housing, and the inside diameter *b* is chosen to overlap the boards at the corners, with thickness to suit the application.

As to materials, it can be seen that the designs of the various components lend themselves to extrusion from a wide variety of materials.

The housing can be of metal such as aluminum, brass or steel, or it can be made of a rigid grade of one of the common structural plastics such as the melamine, phenolic, urea, or polycarbonate plastics.

The component boards and slide rails and slide rail caps are preferably of electrically insulative material such as one of the plastics named; the slide rails should be made of one of the more elastic grades. These parts can be injection molded, or can be extruded and machined.

The spider brace can be extruded from one of the plastics named, or from metal.

It is to be noted that constructing a housing becomes merely a matter of selecting the desired tube diameter, cutting to length, and fitting the ends with closures. No welding or difficult machinings are necessary; the exterior of the tube may be clamped directly although lugs 6 may be employed as in FIGS. 1 and 2, if desired.

In a similar way, the interior components may be cut to length, assembled, and installed without conventional fasteners or hardware.

It can be seen that the simplicity and symmetry of the design of this invention makes size estimation, balancing, and load distribution very easy. The longitudinal passages facilitate purging with inert gas after assembly, and facilitate control of heat distribution during operation.

Although this invention has been described with particularity for the sake of exposition, it will be understood that the invention may be practiced otherwise than as precisely detailed, yet within the spirit of the invention. For example, the number of component boards may be more or less than the number shown without departure from the principles of the invention.

I claim:

1. Demountable assembly and packaging means for protecting electronic components against vibrational and environmental extremes, comprising the combination of: cylindrical shell means for containing said assembly, detachable end closure means for sealing the cylindrical shell means to form a hermetic container, plural elongated circuit board means assembled longitudinally in the cylindrical shell means in edge-to-edge lateral relation with each other around the inner periphery of the cylindrical shell means, means for detachably mounting said plural elongated circuit board means to said cylindrical shell means, means for electrically interconnecting plural of said plural elongated circuit board means, and detachable means electrically connective through said hermetic container from said plural elongated circuit board means.

2. Demountable assembly and packaging means for protecting electronic components against vibrational and environmental extremes, comprising the combination of: cylindrical shell means for containing said assembly, detachable end closure means for sealing the cylindrical shell means to form a hermetic container, plural elongated circuit board means assembled longitudinally in the cylindrical shell means in edge-to-edge lateral relation around the inner periphery thereof, means for mounting said plural elongated circuit board means to said cylindrical shell means, means for electrically interconnecting plural said means for mounting said plural elongated circuit board means, detachable means electrically connective through said hermetic container from said plural elongated circuit board means, said cylindrical shell means having longitudinal fastener means at the inner surface thereof, and the means for mounting the circuit board means to the cylindrical shell means comprising means engaging the longitudinal fastener means and protruding inwardly therefrom between said laterally related plural elongated circuit board means edges.

3. A device as recited in claim 2, wherein the protruding means for mounting said plural elongated circuit board means has recesses adapted for receiving the edges of the plural elongated circuit board means.

4. A device as recited in claim 3, wherein the means for mounting said plural elongated circuit board means substantially coextends longitudinally with the plural elongated circuit board means, and has outwardly opening longitudinal apertures extending from the portion thereof protrusive between the plural elongated circuit board means and plural apertures transversely connective with the longitudinal aperture for openly receiving therein said means for electrically interconnecting plural said plural elongated circuit board means.

5. A device as recited in claim 4, wherein said protrusive portion of the mounting means is convex and spider means axially central of said cylindrical shell means, said spider means having leg means adapted for radial engagement with said convex protrusive portion of the mounting means.

6. A device as recited in claim 1, wherein said plural elongated circuit board means comprises a rectangular, perforated board having on one face thereof an integral tubular wireway provided with longitudinal and transverse apertures for receiving wires therein

7. A device as recited in claim 6, wherein the board has periodic perforations in the length thereof adjacent said wireway, and wherein transverse apertures of said wireway are in lateral correspondence with plural of said perforations.

8. A device as recited in claim 4, and a cap in said outwardly opening longitudinal aperture of the circuit board mounting means, the cap having plural transverse apertures therein corresponding to said plural transverse apertures in the plural elongated circuit board mounting means.

9. A device as recited in claim 5, wherein said spider means has a tubular longitudinal body, wherein each said leg of the spider means has flange engaging means thereon, and wherein said protrusive portion of the mounting means has flange means for engagement by the spider means.

10. A device as recited in claim 1, and exterior radial fin mounting lugs integral with the cylindrical shell means.